(12) United States Patent
Tanaka

(10) Patent No.: US 10,272,646 B2
(45) Date of Patent: Apr. 30, 2019

(54) ELECTROMAGNETIC SHIELDING MATERIAL

(71) Applicant: JX NIPPON MINING & METALS CORPORATION, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/562,246

(22) PCT Filed: Jun. 18, 2015

(86) PCT No.: PCT/JP2015/067661
§ 371 (c)(1),
(2) Date: Sep. 27, 2017

(87) PCT Pub. No.: WO2016/157553
PCT Pub. Date: Oct. 6, 2016

(65) Prior Publication Data
US 2018/0079176 A1 Mar. 22, 2018

(30) Foreign Application Priority Data
Mar. 31, 2015 (JP) .................................. 2015-074342

(51) Int. Cl.
*B32B 9/00* (2006.01)
*B32B 15/08* (2006.01)
(Continued)

(52) U.S. Cl.
CPC .............. *B32B 15/08* (2013.01); *C23C 22/50* (2013.01); *C23C 22/52* (2013.01); *C23C 22/56* (2013.01);
(Continued)

(58) Field of Classification Search
CPC . B32B 15/08; B32B 2250/05; B32B 2250/42; B32B 2307/206; B32B 2457/00; C23C 8/10; H05K 9/00; H05K 9/0073
(Continued)

(56) References Cited

U.S. PATENT DOCUMENTS

2005/0095449 A1  5/2005 Yanagisawa et al.
2005/0208798 A1  9/2005 Shimoda
(Continued)

FOREIGN PATENT DOCUMENTS

CN    101854794 A    10/2010
EP      2416639 A1    2/2012
(Continued)

OTHER PUBLICATIONS

Fukuda et al., JP 2013/145778 A, Machine Translation (Year: 2013).*

(Continued)

*Primary Examiner* — Travis M Figg
(74) *Attorney, Agent, or Firm* — Drinker Biddle & Reath LLP

(57) ABSTRACT

Provided is an electromagnetic shielding material having improved electromagnetic shielding properties. The present invention relates to an electromagnetic shielding material having a structure in which at least two metal foils are laminated via at least one insulating layer, the electromagnetic shielding material comprising at least one metal oxide layer on at least one boundary surface over which each metal foil is in contact with the insulating layer, the metal oxide layer having a thickness of from 1 to 30 nm.

13 Claims, 2 Drawing Sheets

(51) Int. Cl.
*H05K 9/00* (2006.01)
*C23C 22/50* (2006.01)
*C23C 22/52* (2006.01)
*C23C 22/56* (2006.01)

(52) U.S. Cl.
CPC ......... *H05K 9/0073* (2013.01); *H05K 9/0088* (2013.01); *B32B 2307/206* (2013.01); *B32B 2457/00* (2013.01)

(58) Field of Classification Search
USPC ....................................................... 428/215
See application file for complete search history.

(56) References Cited

U.S. PATENT DOCUMENTS

| | | | |
|---|---|---|---|
| 2008/0012493 A1 | 1/2008 | Lee et al. | |
| 2008/0049410 A1* | 2/2008 | Kawaguchi | H05K 1/0234 361/818 |
| 2010/0206628 A1* | 8/2010 | Matsui | H01J 11/10 174/389 |
| 2013/0206471 A1 | 8/2013 | Kammuri et al. | |
| 2016/0374238 A1 | 12/2016 | Tanaka | |

FOREIGN PATENT DOCUMENTS

| | | |
|---|---|---|
| FR | 2854940 A1 | 11/2004 |
| JP | 07290449 A | 11/1995 |
| JP | 2003060387 A | 2/2003 |
| JP | 2003285002 A | 10/2003 |
| JP | 2006135020 A | 5/2006 |
| JP | 2006156946 A * | 6/2006 |
| JP | 2006156946 A | 6/2006 |
| JP | 200821979 A | 1/2008 |
| JP | 2008288613 A | 11/2008 |
| JP | 2010168605 A | 8/2010 |
| JP | 4602680 B2 | 10/2010 |
| JP | 2013145778 A * | 7/2013 |
| JP | 2013145778 A | 7/2013 |
| JP | 2015015328 A | 1/2015 |
| KR | 20090024821 A | 3/2009 |
| KR | 20090051007 A | 5/2009 |
| TW | 200417309 A | 9/2004 |
| WO | 2011121801 A1 | 10/2011 |

OTHER PUBLICATIONS

Koide et al., JP 2006/156946 A, Machine Translation (Year: 2006).*
Definition of Ferrite.*
International Search Report of International Application No. PCT/JP2015/067661, dated Sep. 11, 2015.
English Translation of the International Preliminary Report on Patentability Chapter II of PCT/JP2015/067661, dated Oct. 5, 2017 (dated Oct. 5, 2017).
European Search Report for PCT/JP2015067661 dated Jun. 15, 2018; 7 pages.

* cited by examiner

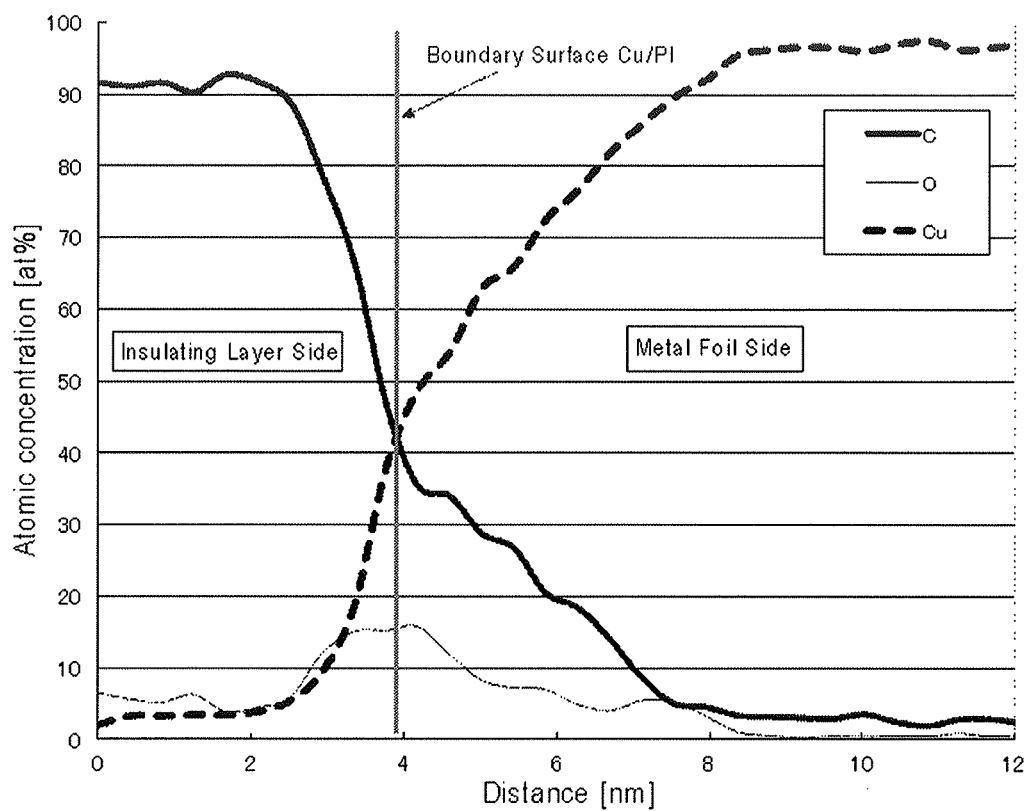
[FIG. 1]

[FIG. 2]
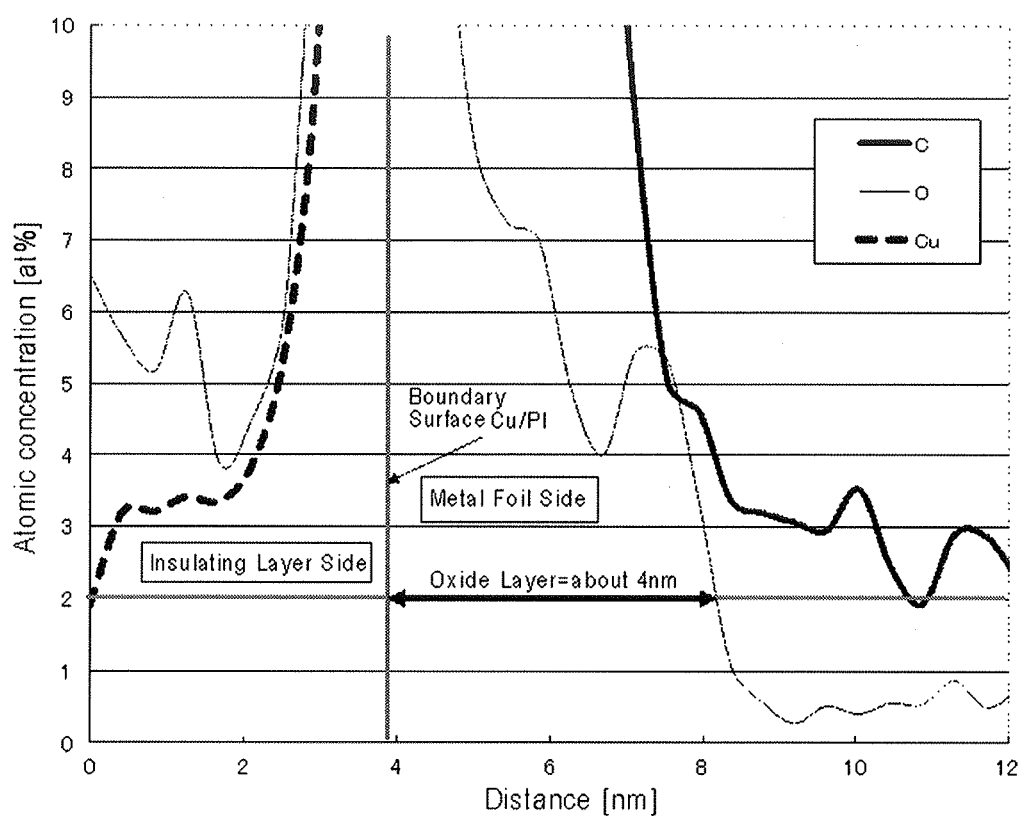

ELECTROMAGNETIC SHIELDING MATERIAL

TECHNICAL FIELD

The present invention relates to an electromagnetic shielding material. More particularly, the present invention relates to a covering material or a cladding material for electric and electronic devices.

BACKGROUND ART

Recently, high attention has been widely focused on global environmental issues, and environmentally-friendly motor vehicles equipped with secondary batteries such as electric vehicles and hybrid vehicles have been progressively developed. The motor vehicles often employ a method of converting direct current generated from the mounted secondary battery into alternating current through an inverter, and then supplying required electric power to the alternating current motor to obtain driving force. Electromagnetic waves are generated due to switching operation of the inverter and the like. Since the electromagnetic waves disturb reception of on-board acoustic equipment or wireless equipment or like, countermeasures have been taken to house the inverter or the battery, motor or like together with the inverter in a metallic case to shield the electromagnetic waves (Japanese Patent Application Laid-open Publication No. 2003-285002 A1).

The electromagnetic waves are emitted not only from the motor vehicles but also from many electric and electronic devices including communication devices, displays and medical devices. The electromagnetic waves may cause erroneous operation of precision devices, and an adverse effect on a human body is further concerned. Therefore, various techniques have been developed for reducing the adverse effects of the electromagnetic waves using an electromagnetic shielding material. For example, a copper foil composite obtained by laminating a copper foil and a resin film has been used as the electromagnetic shielding material (Japanese Patent Application Laid-open Publication No. H07-290449 A1). The copper foil has electromagnetic shielding properties, and the resin film is laminated for reinforcement of the copper foil. An electromagnetic shielding structure is also known, in which metal layers are laminated on an inner side and an outer side of an intermediate layer made of an insulating material, respectively (Japanese Patent No. 4602680). An electromagnetic shielding optical member is also known, which comprises a base substrate and a laminated member formed on one surface of the base substrate and composed of a plurality of repetitive unit films comprising a metal layer and a high refractive index layer of niobium pentoxide (Japanese Patent Application Laid-open Publication No. 2008-21979 A1).

CITATION LIST

Patent Literature

Patent Document 1: Japanese Patent Application Laid-Open Publication No. 2003-285002 A1
Patent Document 2: Japanese Patent Application Laid-Open Publication No. H07-290449 A1
Patent Document 3: Japanese Patent No. 4602680
Patent Document 4: Japanese Patent Application Laid-Open Publication No. 2008-21979 A1

SUMMARY OF THE INVENTION

Technical Problem

Thus, the electromagnetic shielding material composed of a laminate of a metal foil and an insulating layer has been known, but sufficient research has not been conducted for electromagnetic shielding properties of the electromagnetic shielding material having the laminated structure and there has been a need for improvement of the electromagnetic shielding properties. Therefore, an object of the present invention is to improve the electromagnetic shielding properties of the electromagnetic shielding material composed of the laminate of the metal layers and the insulating layer(s).

Solution to Problem

The inventors of the present invention have made studies for the relationship between the electromagnetic shielding material composed of the laminate of the metal foils and the insulating layer(s) and the electromagnetic shielding properties, and found that the thickness of a metal oxide layer on a boundary surface between the metal foil and the insulating layer has had a significant effect on the electromagnetic shielding properties. The inventors also have found that even in the electromagnetic shielding material having the same layer structure, the shielding effect can be increased by 50% or more in dB value by controlling the thickness of the metal oxide layer on the boundary surface between the metal foil and the insulating layer. Therefore, the inventors have found that the required thickness of the electromagnetic shielding material for obtaining the same shielding effect can be markedly reduced by properly controlling the thickness of the metal oxide layer on the boundary surface between the metal foil and the insulating layer, leading to great contribution to weight reduction of the shielding material. The present invention has been completed based on these findings.

In one aspect, the present invention may relate to an electromagnetic shielding material having a structure in which at least two metal foils are laminated via at least one insulating layer, the electromagnetic shielding material comprising at least one metal oxide layer on at least one boundary surface over which each metal foil is in contact with the insulating layer, the metal oxide layer having a thickness of from 1 to 30 nm.

In one embodiment of the electromagnetic shielding material according to the present invention, when a surface of the metal foil is an outer surface of the electromagnetic shielding material, the thickness of the metal oxide layer on the surface of the metal foil may be from 1 to 30 nm.

In another embodiment of the electromagnetic shielding material according to the present invention, each metal foil may have a thickness of from 4 to 50 μm.

In yet another embodiment of the electromagnetic shielding material according to the present invention, the metal foils may have a total thickness of from 8 to 200 μm.

In yet another embodiment of the electromagnetic shielding material according to the present invention, the insulating layer may have relative dielectric constant of from 2.0 to 10.0 at 20° C.

In yet another embodiment of the electromagnetic shielding material according to the present invention, each metal foil may have conductivity of $1.0 \times 10^6$ S/m or more at 20° C.

In yet another embodiment of the electromagnetic shielding material according to the present invention, the insulating layer may have a thickness of from 6 to 500 μm.

In yet another embodiment of the electromagnetic shielding material according to the present invention, the electromagnetic shielding material may have a total thickness of from 14 to 1000 μm.

In another aspect, the present invention may provide a covering material or a cladding material for electric or electronic devices, comprising the electromagnetic shielding material according to the present invention.

In yet another aspect, the present invention may provide an electric or electronic device comprising the covering material or the cladding material according to the present invention.

Advantageous Effects of Invention

According to the present invention, it is possible to improve the electromagnetic shielding properties of the electromagnetic shielding material composed of the laminate of the metal layers and the insulating layer(s). For example, in the motor vehicles, weight reduction is a major issue in terms of improving fuel economy, and according to the present invention, the shielding effect comparable to the conventional one can be achieved by the thinner and lighter electromagnetic shielding material.

BRIEF DESCRIPTION OF THE DRAWINGS

FIG. 1 is a graphical view showing an element concentration distribution near a boundary surface M1/R1 in Example 3.

FIG. 2 is a partially enlarged view of FIG. 1.

DESCRIPTION OF EMBODIMENTS (Metal Foil)

Materials of the metal foils for use in the electromagnetic shielding material according to the present invention are not particularly limited, but metal materials with high conductivity are preferred in terms of improving the shielding properties against an alternating magnetic field and an alternating electric field. Specifically, the metal foils may be preferably formed by a metal having conductivity of $1.0 \times 10^6$ S/m (a value at 20° C.; the same will apply hereinafter) or more. The conductivity may preferably be $10.0 \times 10^6$ S/m or more, and still more preferably $30.0 \times 10^6$ S/m or more, and most preferably $50.0 \times 10^6$ S/m or more. Examples of the metal include iron having conductivity of about $9.9 \times 10^6$ S/m, nickel having conductivity of about $14.5 \times 10^6$ S/m, aluminum having conductivity of about $39.6 \times 10^6$ S/m, copper having conductivity of about $58.0 \times 10^6$ S/m, and silver having conductivity of about $61.4 \times 10^6$ S/m. In view of both electric resistivity and costs, aluminum or copper may preferably be used for practical use. All of the metal foils used in the electromagnetic shielding material according to the present invention may be the same metal, or different metals may be used for each layer. Further, alloys of the metals as stated above may be used.

When using the copper foils as the metal foils, copper having higher purity may be preferred because it will improve the shielding performance. The purity may preferably be 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability. When alloy elements are added to the copper foil to form a copper alloy foil, the total content of these elements and inevitable impurities may be less than 0.5% by mass. In particular, the copper foil may preferably contain one or more selected from the group consisting of Sn, Mn, Cr, Zn, Zr, Mg, Ni, Si, and Ag in the total amount of 200 to 2000 ppm by mass, in order to improve elongation as compared with a pure copper foil having the same thickness.

The electromagnetic shielding effect can be significantly improved by controlling the metal oxide layer on the boundary surface over which each metal foil and the insulating layer used for the electromagnetic shielding material are in contact with each other. Although the invention is not intended to be limited by any theory, impedance of the metal oxide layer is generally larger than that of the metal foil and smaller than that of the insulating layer, so that the presence of the metal oxide on the boundary surface between the insulating layer and the metal foil would alleviate an impedance mismatch and reduce reflection, leading to reduction of the shielding effect. As the oxide layer becomes thicker, the reduction of the shielding effect is increased by the alleviation of the impedance mismatch. Therefore, a thinner metal oxide layer may be preferred. As a reference, the impedance (theoretical value or literature value) of copper, copper (I) oxide ($Cu_2O$) and a resin (relative dielectric constant=3) at 500 kHz is shown in Table 1.

Comparison of Impedance of Copper, Copper (I) Oxide and the Resin at 500 kHz:

TABLE 1

|  | Impedance (Ω) |
|---|---|
| Copper | $7.0 \times 10^{-7}$ |
| $Cu_2O$ | 5.0 to 17.0 |
| Resin (Relative Dielectric Constant = 3) | 218 |

$Z = Z_0 \times \sqrt{(\mu_r / \varepsilon_r)}$;

Z: impedance (Ω) to be determined;

$Z_0$: impedance in vacuum=377 Ω;

$\mu_r$: relative permeability (1 for copper, copper (I) oxide and the resin);

$\varepsilon_r$: relative dielectric constant.

The relative dielectric constant of the metal and metal oxide is approximated to be $\varepsilon_r = -j\sigma/(2\pi f \varepsilon_0)$.

j: imaginary unit;

σ: conductivity (S/m); $58 \times 10^6$ for copper, and $10^{-6}$ to $10^{-7}$ for $Cu_2O$ (reference literature: Kobe Steel Technical Report, Vol. 62, No. 2);

f: frequency (Hz)

$\varepsilon_0$: dielectric constant in vacuum.

More specifically, the thickness of the metal oxide layer on each boundary surface may preferably be 30 nm or less, and more preferably 20 nm or less, and still more preferably 15 nm or less, and even more preferably 10 nm or less, in order to significantly improving the shielding effect. Although it is desirable that the metal oxide layer is thinner, it is realistically difficult to achieve the thickness of the metal oxide layer of 0.5 nm or less because the metal surface is naturally oxidized, which will not significantly contribute to the shielding effect. Therefore, the thickness of the metal oxide layer on each boundary surface may be generally 0.5 nm or more, and typically 1 nm or more, and more typically 2 nm or more.

In addition to the metal oxide layer on the boundary surface over which each metal foil and the insulating layer used for the electromagnetic shielding material are in contact with each other, when the outer surface of the electromagnetic shielding material is the surface of the metal foil, the electromagnetic shielding effect can also be further improved by controlling the metal oxide layer on the surface. Without wishing to be bound by any theory, it is presumed that the further improvement of the electromagnetic shielding effect would occur for the following reasons: The thinner metal oxide layer on the outer surface would decrease contact resistance between the metal foil and the ground (in Examples, the metal foil is connected to the ground in contact with a KEC method measuring housing). If the contact resistance between the metal foil and the ground is lower, the shielding effect is better because the potential of the metal foil is constantly maintained at the ground potential even if the metal foil receives the electromagnetic waves. On the other hand, if the contact resistance is higher, the shielding effect decreases because the potential of the metal foil varies due to the electromagnetic waves.

More particularly, the thickness of the metal oxide layer on the surface of the metal foil, which is the outer surface of the electromagnetic shielding material, may preferably be 30 nm or less, and more preferably 20 nm or less, and still more preferably 15 nm or less, and still more preferably 10 nm or less, in order to significantly improving the shielding effect. Although it is desirable that the metal oxide layer is thinner, it is realistically difficult to achieve the thickness of the metal oxide layer of 0.5 nm or less because the metal surface is naturally oxidized, which will not significantly contribute to the shielding effect. Therefore, the thickness of the metal oxide layer on the metal foil surface which is the outer surface of the electromagnetic shielding material may be generally 0.5 nm or more, and typically 1 nm or more, and more typically 2 nm or more.

In the present invention, the thickness of the metal oxide layer is measured by the following procedures. The measurement is performed at any three or more positions, and the average value at the three or positions is defined as the measurement value.

(1) Case where the thickness of the metal oxide layer on the outer surface is measured when the metal foil forms the outer surface of the electromagnetic shielding material:

The electromagnetic shielding material to be measured is cut in the thickness direction by FIB (Focused Ion Beam Processing Observation Apparatus; in Examples, model FB-2100 from Hitachi Ltd. was used). The exposed cross section is then subjected to elemental analysis starting from the metal foil surface in the thickness direction at a measurement interval of 2 nm by STEM (Scanning Transmission Electron Microscopy) to measure oxygen atom concentration at each measurement point. Then, a range from the surface to a distance, within which the oxygen atom concentration is maintained at 2 at. % or more, is defined as the thickness of the metal oxide layer. That is, the thickness of the metal oxide layer refers to a distance from the surface to a position where the oxygen atom concentration is initially below 2 at. %. If the metal foil and the insulating layer are simply laminated and not bonded to each other, the measurement may be performed after separating the metal foil and the insulating layer.

(2) Case where the thickness of the metal oxide layer on the boundary surface over which the metal foil and the insulating layer is in contact with each other:

(2-1) Case where the metal foil and the insulating layer does not adhere by an adhesive and can be easily released:

The metal foil to be measured is separated from the insulating layer in the electromagnetic shielding material and then cut in the thickness direction by the FIB (Focused Ion Beam Processing Observation Device; in Examples, model FB-2100 from Hitachi Ltd. was used). The exposed cross section is then subjected to elemental analysis starting from the metal foil surface in the thickness direction at a measurement interval of 2 nm by the STEM (Scanning Transmission Electron Microscopy) to measure the oxygen atom concentration at each measurement point. Then, a range from the surface to a distance, within which the oxygen atom concentration is maintained at 2 at. % or more, is defined as the thickness of the metal oxide layer.

(2-2) Case where the metal foil and the insulating layer adhere by an adhesive:

The electromagnetic shielding material is cut in the thickness direction by the FIB (Focused Ion Beam Processing Observation Apparatus). The exposed cross section is then subjected to elemental analysis near the boundary surface in the thickness direction at the measurement interval of 2 nm by the STEM (Scanning Transmission Electron Microscopy) to measure the oxygen atom concentration at each measurement point. A point where the atomic concentration of the main component making up the metal foil (which refers to an element having the highest component proportion ratio and if there are a plurality of elements having the highest component proportion ratio, a total value of the elements; the same is true for the insulating layer) and the atomic concentration of the main component making up the insulating layer are reversed is defined as the boundary surface of the metal foil/insulating layer. A range within which the oxygen atom concentration is maintained at 2 at. % or more on the metal foil side from the boundary surface is defined as the thickness of the metal oxide layer.

Measurement conditions for the elemental analysis by the STEM are as follows: measuring apparatus: field-emission transmission electron microscopy with Cs collector (In Examples, model JEM-2100 F measuring apparatus with Cs collector from JEOL Ltd. was used);
elemental analysis method: EDS analysis;
acceleration voltage: 200 kV
magnification: 500,000.

The thickness of the metal foils used for the electromagnetic shielding material according to the present invention may preferably be 4 µm or more per one foil. If the thickness is less than 4 µm, the ductility of the metal foil may be remarkably lowered, leading to insufficient formability of the shielding material. Also, if the thickness of the foils per one foil is less than 4 µm, the lamination of a large number of metal foils will be required for obtaining the improved electromagnetic shielding effect, thereby causing a problem of an increase in manufacturing costs. From this viewpoint, the thickness of the metal foils per one foil may preferably be 10 µm or more, and more preferably 15 µm or more, and still more preferably 20 µm or more, and even more preferably 25 µm or more, and still more preferably 30 µm or more. On the other hand, if the thickness of the foils per one foil exceeds 50 µm, the formability will be deteriorated. Therefore, the thickness of the foils per one foil may preferably be 50 µm or less, and more preferably 45 µm or less, and more preferably 40 µm or less.

It is necessary that at least two metal foils are present in the electromagnetic shielding material in terms of ensuring the improved electromagnetic shielding properties while reducing the total thickness of the metal foils. The number of the metal foils may preferably be three or more. The three or more metal foil layers can suppress an increase in the required total thickness of the metal foils for obtaining the magnetic field shielding property of 30 dB or more in a low frequency region of about 1 MHz frequency and do not need to increase the thickness of one metal foil, so that the formability will be improved. Further, the lamination of the three or more metal foils significantly improves the shielding effect as compared with a single metal foil layer or the lamination of two metal foil layers, even if the total thickness of these metal foils is the same. However, although the lamination of more metal foils tends to improve the electromagnetic shielding properties, the increased number of the laminated metal foils increase the number of lamination steps, which will lead to an increase in manufacturing costs and will not provide further improvement of the shielding effect. Therefore, the number of the metal foils in the shielding material may preferably be 5 or less, and more preferably 4 or less.

Therefore, in one embodiment of the electromagnetic shielding material according to the present invention, the total thickness of the metal foils may be from 8 to 200 μm, and typically from 15 to 150 μm, or 100 μm or less, or 80 μm or less, or 60 μm or less. In the present invention, the thickness of the metal foil is defined as the thickness including that of the metal oxide layer that can be formed on the surface of the metal foil.

Various surface treated layers may be formed on the surface of the metal foil for the purpose of adhesion promotion, environmental resistance, heat resistance and rust prevention. For example, the metal foils may be subjected to Au plating, Ag plating, Sn plating, Ni plating, Zn plating, Sn alloy plating (Sn—Ag, Sn—Ni, Sn—Cu, and the like) or like, in order to improve environmental resistance and heat resistance that will be required when the metal surface is the outermost layer. These treatments may be combined. The Sn plating or the Sn alloy plating may be preferred in terms of costs. Further, the metal foils may be subjected to a roughening treatment, Ni plating or like in order to improving adhesion between the metal foil and the insulating layer. These treatments may be combined. The roughening treatment may be preferred because it will easily provide the adhesion. Further, it is possible to provide at least one metal layer having high relative magnetic permeability in order to improve the shielding effect against the direct current magnetic field. Examples of the metal layer having high relative magnetic permeability include Fe—Ni alloy plating, Ni plating, and the like.

However, it should be noted that depending on the type of the surface treatment, a metal oxide layer may be formed. A chromate treatment is often performed as the surface treatment of the metal, but the chromate treatment forms a chromium oxide layer on the surface of the metal foil. Therefore, the chromate treatment is not preferable because it causes a decrease in the electromagnetic shielding effect.

Also, the production of the metal foil may involve a heat treatment, but even if the atmosphere is controlled, the metal foil reacts with residual oxygen to grow the metal oxide. In order to prevent it, the surface must be washed under appropriate conditions to remove the oxide after the heat treatment.

(Insulating Layer)

In the electromagnetic shielding material according to the present invention, significant improvement of the electromagnetic shielding effect by laminating a plurality of metal foils can be obtained by interposing the insulating layer between the metal foils. Although even if the metal foils are directly stacked with each other, the shielding effect may be improved due to an increase in the total thickness of the metal foils, the significant improvement effect cannot be obtained. The reason would be that the presence of the insulating layer between the metal foils increases the number of reflections of electromagnetic waves to attenuate the electromagnetic waves.

The insulating layer having a large impedance difference from the metal layer may be preferred in order to obtain the improved electromagnetic shielding effect. To generate the large impedance difference (impedance mismatch), smaller relative dielectric constant of the insulating layer may be required. More specifically, the relative dielectric constant may preferably be 10.0 (a value at 20° C.; the same will apply hereinafter) or less, and more preferably 5.0 or less, and still more preferably 3.5 or less. In principle, the relative dielectric constant is never smaller than 1.0. In a generally available material, the relative dielectric constant is at least about 2.0. Even if the relative dielectric constant is lowered to be close to 1.0, the increase in the shielding effect is limited, whereas a special and expensive material must be used. In view of the balance between the cost and the effect, the relative dielectric constant may preferably be 2.0 or more, and more preferably 2.2 or more.

Specific examples of the material making up the insulating layer includes glass, papers, natural resins, synthetic resins and the like. Among them, the synthetic resins may be preferred in terms of processability. The materials may contain fiber reinforcing materials such as carbon fibers, glass fibers and aramid fibers. In terms of availability and processability, the synthetic resins include olefin resins such as polyesters, polyethylene and polypropylene, including PET (polyethylene terephthalate), PEN (polyethylene naphthalate) and PBT (polybutylene terephthalate); polyamides, polyimides, liquid crystal polymers, polyacetals, fluororesins, polyurethanes, acryl resins, epoxy resins, silicone resins, phenol resins, melamine resins, ABS resin, polyvinyl alcohol, urea resins, polyvinyl chloride, polycarbonates, polystyrenes, styrene butadiene rubbers and the like. Among them, PET, PEN, polyamides, and polyimides may be preferred in terms of processability and costs. The synthetic resins may be elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. Furthermore, the synthetic resin itself may play a role of an adhesive, in which case the metal foils will be laminated via the adhesive. Examples of the adhesive include, but not limited to, acryl resin-based adhesives, epoxy resin-based adhesives, urethane-based adhesives, polyester-based adhesives, silicone resin-based adhesive, vinyl acetate-based adhesives, styrene butadiene rubber-based adhesives, nitrile rubber-based adhesives, phenol resin-based adhesives, cyanoacrylate-based adhesives, and the like. The urethane-based, polyester-based, and vinyl acetate-based adhesives may be preferred in terms of ease of manufacture and costs.

It should be noted that in the present invention, the metal oxide layer is excluded from the material making up the "insulating layer".

The resin material can be laminated in the form of film or fiber. Although the resin layer may be formed by applying an uncured resin composition to the metal foil and then curing it, it is preferable to use a resin film that can be attached to the metal foil in terms of easy manufacturing. In particular, a PET film may be suitably used. More particularly, the use of a biaxially stretched film as the PET film can increase the strength of the shielding material.

The thickness of the insulating layers is not particularly limited, but since the thickness of one insulating layer of less than 6 μm tends to decrease a (elongation) breaking strain of the shielding material. Therefore, the thickness of one insulating layer may preferably be 6 μm or more, and more preferably 8 μm or more, and more preferably 10 μm or more, and still more preferably 20 μm or more, and still more preferably 40 μm or more, and even more preferably 80 μm or more, and still more preferably 100 μm or more. On the other hand, the thickness of one insulating layer more than 500 μm also tends to decrease the (elongation) breaking strain of the shielding material. Therefore, the thickness of one insulating layer may preferably be 500 μm or less, and more preferably 400 μm or less.

The laminate may be produced by using the adhesive between the insulating layer and the metal foil, or simply laminating the insulating layer and the metal foil without using the adhesive. In view of the integrity of the electromagnetic shielding material, at least end portions (for example, each side when the shielding material is in the form of quadrangle) may preferably be bonded by the adhesive. On the other hand, if the insulating layer is laminated on the metal foil by thermocompression bonding, the metal surface is oxidized by supply of oxygen from the residual atmospheric oxygen or the resin even if the atmosphere is controlled, so that the metal foil and the resin may preferably be laminated at normal temperature, rather than by hot pressing. Also, when a step such as drying of the adhesive is required, the drying may preferably be carried out at a temperature as low as possible. Also, after lamination, the outer surface of the electromagnetic shielding material may preferably be washed under appropriate conditions to remove the oxide, particularly when heated.

The same adhesives as described above may be used, including, but not limited to, acryl resin-based adhesives, epoxy resin-based adhesives, urethane-based adhesives, polyester-based adhesives, silicone resin-based adhesives, vinyl acetate-based adhesives, styrene butadiene rubber-based adhesives, nitrile rubber-based adhesives, phenol resin-based adhesives, cyanoacrylate-based adhesives and the like. Among them, the urethane-based adhesives, the polyester-based adhesives and the vinyl acetate-based adhesives may be preferred in terms of easy manufacturing and costs.

The thickness of the adhesive layer may preferably be 6 μm or less. If the thickness of the adhesive layer exceeds 6 μm, only the metal foils tend to be broken after being laminated into the metal foil composite. However, when the adhesive layer also serves as the insulating layer as discussed above, the thickness of the adhesive layer may not be limited thereto, and may be the thickness as described above in the section of the insulating layer.

The electromagnetic shielding material according to the present invention should have a structure in which at least two metal foils are laminated via at least one insulating layer. Examples of the laminated structure having the requirement are as follows. It should be noted that the layer represented by the parenthesis means that the layer may be optionally added.

(1) (insulating layer)/metal foil/insulating layer/metal foil/ (insulating layer);
(2) (insulating layer)/metal foil/insulating layer/metal foil/ insulating layer/metal layer/(insulating layer); and
(3) (insulating layer)/metal foil/insulating layer/metal foil/ insulating layer/metal foil/insulating layer/metal foil/(insulating layer).

In the items (1) to (3), one "metal foil" can be formed by laminating a plurality of metal foils without interposing the insulating layer, and one "insulating layer" can also be formed by laminating a plurality of insulating layers without interposing the metal foil. Further, it is also possible to provide at least one layer other than the insulating layers and the metal foils.

In one embodiment of the electromagnetic shielding material according to the present invention, the total thickness of the electromagnetic shielding material may be from 14 to 1000 μm, or 800 μm or less, or 600 μm or less, or 400 μm or less, or 200 μm or less.

The electromagnetic shielding material according to the present invention can be used for various electromagnetic shielding applications such as covering materials or cladding materials, in particular for electric and electronic devices (for example, inverters, communication devices, resonators, electron tubes, discharge lamps, electric heating devices, electric motors, generators, electronic components, printed circuits, medical devices and the like), covering materials for harnesses and communication cables connected to the electric and electronic devices, electromagnetic shielding sheets, electromagnetic shielding panels, electromagnetic shielding bags, electromagnetic shielding boxes, electromagnetic shielding chambers, and the like.

According to one embodiment of the electromagnetic shielding material according to the present invention, the electromagnetic shielding material may have a magnetic field shielding property (a degree of an attenuated signal on a receiving side) of 20 dB or more at 500 kHz, and preferably a magnetic field shielding property of 25 dB or more, and more preferably a magnetic field shielding property of 30 dB or more, for example a magnetic field shielding property of 20 to 40 dB. In the present invention, the magnetic field shielding property is measured by a KEC method. The KEC method refers to "an electromagnetic shielding property measurement method" in KEC Electronic Industry Development Center.

EXAMPLE

Examples of the present invention are described below together with comparative examples, which are provided for a better understanding of the present invention and its advantages, and are not intended to limit the invention.

Each metal foil and each insulating film as shown in Table 2 were prepared and electromagnetic shielding materials of Examples and Comparative Examples were produced. Each symbol described in Table 2 has the following meanings. The conductivity of the metal foil was measured by the double bridge method according to JIS C2525: 1999. The relative dielectric constant was measured by the B method according to JIS C2151: 2006.

Cu: rolled copper foil (conductivity at 20° C.: $58.0 \times 10^6$ S/m);
Al: aluminum foil (conductivity at 20° C.: $39.6 \times 10^6$ S/m);
Electrolytic Cu: electrolytic copper foil (conductivity at 20° C.: $56.0 \times 10^6$ S/m);

Ni: nickel foil (conductivity at 20° C.: 14.5×10$^6$ S/m);
Fe: soft iron foil (conductivity at 20° C.: 9.9×10$^6$ S/m);
PI: polyimide film (relative dielectric constant at 20° C.: 3.5);
PET: polyethylene terephthalate film (relative dielectric constant at 20° C.: 3.0);
PTFE: polytetrafluoroethylene film (relative dielectric constant at 20° C.: 2.1);
PA: polyamide film (relative dielectric constant at 20° C.: 6.0); and
PVC: polyvinyl chloride (relative dielectric constant at 20° C.: 3.3).

Comparative Examples 1 and 2

Single Metal Foil

For rolled copper foils (thickness: 68 μm) and an aluminum foil (thickness: 100 μm), their surfaces were degreased and washed with an acid to remove metal oxides, and the magnetic field shielding effect of the single layer was examined. Each of the prepared metal materials was set to a magnetic field shielding effect evaluation apparatus (Model TSES-KEC available from Techno Science Japan Co., Ltd.) and the magnetic field shielding effect was evaluated at a frequency of 500 kHz and at 20° C. according to the KEC method. Further, after exposing the cross section of each metal material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

Comparative Example 3

Two Metal Foils

Two rolled copper foils (thickness: 33 μm) were prepared and a surface of each foil was degreased and washed with an acid to remove metal oxides. These foils were then laminated without using an adhesive to prepare a laminate. The resulting laminate was set to the magnetic field shielding effect evaluation apparatus (Model TSES-KEC available from Techno Science Japan Co., Ltd.), and the magnetic field shielding effect was evaluated by the same method as described in Comparative Example 1. Further, after exposing the cross section of each metal material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

Comparative Example 4

Thicker Metal Oxide Layers

A polyethylene terephthalate (PET) film having a thickness of 250 μm was used as the insulating layer. Rolled copper foils each having a thickness of 7 μm were used as the metal foil and were subjected to an electrolytic treatment at current density of 3 A/dm$^2$ in a chromate treatment solution (K$_2$ Cr$_2$ O$_7$: 4 g/L, pH 3.5) to form a chromate layer on the surface of each copper foil. The prepared insulating layer and the metal foils were pressed at a pressure of 220 N/cm$^2$ and at a temperature of 25° C. to produce an electromagnetic shielding material having a laminated structure as described in Table 2. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1. Further, after exposing the cross section of each electromagnetic shielding material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

Furthermore, the order of M1 layer, R1 layer, M2 layer, R2 layer and M3 layer in Table 2 corresponds to the order of the materials represented by "Laminated Structure" shown in Table 2 (the same will apply hereinafter).

Comparative Example 5

Thicker Metal Oxide Layers

A polyimide (PI) film having a thickness of 100 μm was used as the insulating layer, and rolled copper foils each having a thickness of 17 μm was used as the metal foil.

The surface of each metal foil was degreased and washed with an acid to remove metal oxides. The PI film and the rolled copper foils were pressed at a pressure of 220 N/cm$^2$ and at a temperature of 200° C. to produce an electromagnetic shielding material having a laminate structure as described in Table 2. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1. Further, after exposing the cross section of each electromagnetic shielding material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

Comparative Example 6

Thicker Metal Oxide Layers

Polyimide (PI) films each having a thickness of 12 μm as the insulating layer and copper foils each having a thickness of 17 μm as the metal foil were laminated by pressing them at a pressure of 220 N/cm$^2$ and at a temperature of 200° C. without removing metal oxides on the metal foil surface to produce an electromagnetic shielding material having a laminated structure as described in Table 2. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1. Further, after exposing the cross section of each electromagnetic shielding material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

Examples 1, 3 to 13, and 15 to 20

The insulating film(s) having the thickness and type as shown in Table 2, as well the metal foils each having the thickness and type as shown in Table 2 were simply laminated without using an adhesive to produce an electromagnetic shielding material having a laminated structure as described in Table 2. Each metal foil was used after removing metal oxides by degreasing and acid-washing the surface. The thickness of the metal oxide layer was adjusted by changing the concentration of the acid used for washing (for the washing with the acid, the concentration of an aqueous $H_2SO_4$ solution was changed from 5 to 100 g/L) and the washing time (changed from 1 to 60 seconds) in each Example. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1. Further, after exposing the cross section of each electromagnetic shielding material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

FIG. 1 schematically illustrates the element concentration distribution near the boundary surface M1/R1 of Example 3. As can be seen from FIG. 1, the point where the atomic concentration of Cu that is the main component making up the metal foil M1 and the atomic concentration of C that is the main component of the insulating layer R1 are reversed is present at a distance of about 4 nm on the graph. The point is the boundary surface between the metal foil and the insulating layer. FIG. 2, which is a partially enlarged view of FIG. 1, shows that on the metal foil side from the boundary surface, the point where the oxygen atom concentration is below 2 at. % or more is present at a distance of about 4 nm from the boundary surface. Therefore, it is understood from FIG. 2 that the thickness of the metal oxide layer is 4 nm.

Example 2, 14 The insulating film having the thickness and type as shown in Table 2, as well the metal foils each having the thickness and type as shown in Table 2 were laminated using adhesives (a main agent RU-80 and a curing agent H-5, available from ROCK PAINT) to produce an electromagnetic shielding material having a laminated structure as described in Table 2. Each metal foil was used after removing metal oxides by degreasing and acid-washing the surface. The thickness of the metal oxide layer was adjusted by changing the concentration of the acid used for washing and the washing time in each Example. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1. Further, after exposing the cross section of each electromagnetic shielding material by FIB (Focused Ion Beam Processing Observation Apparatus, Model FB-2100 from Hitachi Ltd.), the thickness of the metal oxide layer at the position as shown in Table 2 was measured with STEM (Scanning Transmission Electron Microscope: model JEM-2100F from JEOL Ltd.) by the measurement method as described above.

(Discussion)

The results are shown in Table 2. In Comparative Examples 1 to 3, each electromagnetic shielding material was produced by using only the metal foil(s). Although the thickness of the metal oxide layer on the surface was thinner, any high electromagnetic shielding effect could not be obtained because the electromagnetic shielding material was not a laminate of the metal foils and the insulating layer(s). Each of Comparative Examples 4-6 was the electromagnetic shielding material formed by laminating the metal foils via the Insulating layer, but any high electromagnetic shielding effect could not be obtained, because the thickness of the metal oxide layer on the boundary surface between the outer surface of the metal foil and the insulating layer was thicker.

On the other hand, each of Examples 1 to 20 was the electromagnetic shielding material formed by laminating the metal foils via the insulating layer(s), and the thickness of the metal oxide layer on the boundary surface between the outer surface of the metal foil and the insulating layer is thinner, so that the electromagnetic shielding effect was significantly improved. For example, Example 6 and Comparative Example 5 had the laminated structures having the same number, type and thickness of the metal foils and the insulating layers, but the shielding effect was increased by 70% or more in the dB value for Example 6. Further, Example 19 and Comparative Example 6 had the laminated structures having the same number, type and thickness of the metal foils and the insulating layers, but the shielding effect was increased by 100% or more in the dB value for Example 19. These would demonstrate a synergistic effect obtained by both suppression of the thickness of the metal oxide layer and the use of the three metal foils.

TABLE 2-1

|  | Laminated Structure | M1 (First Metal) Layer Thickness μm | R1 (First Resin) Layer Thickness μm | M2 (Second Metal) Layer Thickness μm | R2 (Second Resin) Layer Thickness μm | M3 (Third Metal) Layer Thickness μm |
|---|---|---|---|---|---|---|
| Example 1 | Cu/PET/Cu | 8 | 500 | 8 | — | — |
| Example 2 | Cu/PET/Cu | 33 | 100 | 33 | — | — |
| Example 3 | Cu/PI/Cu | 33 | 12 | 33 | — | — |
| Example 4 | Cu/PET/Cu | 17 | 200 | 17 | — | — |
| Example 5 | Cu/PTFE/Cu | 17 | 100 | 17 | — | — |
| Example 6 | Cu/PI/Cu | 17 | 100 | 17 | — | — |
| Example 7 | Cu/PA/Cu | 17 | 100 | 17 | — | — |
| Example 8 | Cu/PVC/Cu | 17 | 100 | 17 | — | — |
| Example 9 | Cu/PET/Cu | 17 | 100 | 17 | — | — |
| Example 10 | Cu/PET/Cu | 17 | 100 | 17 | — | — |
| Example 11 | Al/PTFE/Al | 20 | 100 | 20 | — | — |
| Example 12 | Al/PET/Al | 12 | 400 | 12 | — | — |
| Example 13 | Al/PET/Cu | 20 | 100 | 12 | — | — |
| Example 14 | Al/PET/Al | 40 | 50 | 40 | — | — |
| Example 15 | Al/PA/Al | 20 | 200 | 20 | — | — |
| Example 16 | Electrolytic Cu/PET/Electrolytic Cu | 18 | 100 | 18 | — | — |
| Example 17 | Ni/PET/Ni | 30 | 300 | 30 | — | — |
| Example 18 | Fe/PET/Fe | 30 | 500 | 30 | — | — |
| Example 19 | Cu/PET/Cu/PET/Cu | 17 | 12 | 17 | 12 | 17 |
| Example 20 | Al/PET/Al/PET/Al | 20 | 50 | 20 | 50 | 20 |
| Comp. 1 | Cu | 68 | — | — | — | — |
| Comp. 2 | Al | 100 | — | — | — | — |
| Comp. 3 | Cu/Cu | 33 | — | 33 | — | — |
| Comp. 4 | Cu/PET/Cu | 7 | 250 | 7 | — | — |
| Comp. 5 | Cu/PI/Cu | 17 | 100 | 17 | — | — |
| Comp. 6 | Cu/PI/Cu/PI/Cu | 17 | 12 | 17 | 12 | 17 |

TABLE 2-2

|  | Oxide Layer | | | | | | Shielding Effect at 500 kHz dB |
|---|---|---|---|---|---|---|---|
|  | Outer Surface M1 | Boundary Surface M1/R1 Outer Surface M1 | Boundary Surface R1/M2 | Outer Surface M2 Boundary Surface M2/R2 | Boundary Surface R2/M3 | Outer Surface M3 | |
| Example 1 | 3 | 2 | 2 | 3 | — | — | 30.9 |
| Example 2 | 16 | 15 | 15 | 13 | — | — | 35.0 |
| Example 3 | 5 | 4 | 5 | 5 | — | — | 22.8 |
| Example 4 | 12 | 12 | 12 | 12 | — | — | 31.6 |
| Example 5 | 3 | 6 | 4 | 6 | — | — | 27.6 |
| Example 6 | 4 | 3 | 3 | 3 | — | — | 28.1 |
| Example 7 | 2 | 2 | 1 | 2 | — | — | 28.6 |
| Example 8 | 5 | 5 | 4 | 5 | — | — | 27.8 |
| Example 9 | 1 | 2 | 1 | 1 | — | — | 28.6 |
| Example 10 | 22 | 25 | 20 | 28 | — | — | 21.7 |
| Example 11 | 6 | 7 | 7 | 5 | — | — | 23.9 |
| Example 12 | 4 | 4 | 5 | 6 | — | — | 28.4 |
| Example 13 | 7 | 8 | 7 | 8 | — | — | 23.7 |
| Example 14 | 6 | 5 | 6 | 4 | — | — | 29.5 |
| Example 15 | 7 | 7 | 7 | 7 | — | — | 29.7 |
| Example 16 | 2 | 1 | 2 | 2 | — | — | 29.0 |
| Example 17 | 7 | 5 | 5 | 4 | — | — | 24.6 |
| Example 18 | 3 | 3 | 3 | 3 | — | — | 25.5 |
| Example 19 | 5 | 4 | 4 | 3 | 5 | 4 | 21.2 |
| Example 20 | 6 | 6 | 4 | 8 | 5 | 7 | 32.0 |
| Comp. 1 | 3 | 3 | — | — | — | — | 19.9 |
| Comp. 2 | 5 | 4 | — | — | — | — | 19.8 |
| Comp. 3 | 4 | 3 | 4 | 4 | — | — | 19.7 |
| Comp. 4 | 34 | 35 | 31 | 31 | — | — | 16.2 |
| Comp. 5 | 32 | 30 | 34 | 32 | — | — | 16.4 |
| Comp. 6 | 54 | 35 | 42 | 39 | 44 | 58 | 10.5 |

What is claimed is:

1. An electromagnetic shielding material having a structure in which at least two metal foils are laminated via at least one insulating layer, the electromagnetic shielding material comprising at least one metal oxide layer on at least one boundary surface over which each metal foil is in contact with the insulating layer, the metal oxide layer having a thickness of from 1 to 20 nm, wherein the metal oxide layer comprises an oxide of only the metal(s) included in the metal foil(s) and oxygen.

2. The electromagnetic shielding material according to claim 1, wherein at least one of the metal foils comprises an outer surface of the electromagnetic shielding material, the thickness of the metal oxide layer on the surface of the metal foil is from 1 to 30 nm.

3. The electromagnetic shielding material according to claim 1, wherein each metal foil has a thickness of from 4 to 50 μm.

4. The electromagnetic shielding material according to claim 1, wherein the metal foils have a total thickness of from 8 to 200 μm.

5. The electromagnetic shielding material according to claim 1, wherein the insulating layer has relative dielectric constant of from 2.0 to 10.0 at 20° C.

6. The electromagnetic shielding material according to claim 1, wherein each metal foil has conductivity of $1.0 \times 10^6$ S/m or more at 20° C.

7. The electromagnetic shielding material according to claim 1, wherein the insulating layer has a thickness of from 6 to 500 μm.

8. The electromagnetic shielding material according to claim 1, wherein the electromagnetic shielding material has a total thickness of from 14 to 1000 μm.

9. A covering material or a cladding material for electric or electronic devices, comprising the electromagnetic shielding material according to claim 1.

10. An electric or electronic device comprising the covering material or the cladding material according to claim 9.

11. The electromagnetic shielding material according to claim 7, wherein the thickness of the insulating layer is from 40 to 500 μm.

12. The electromagnetic shielding material according to claim 1, wherein the thickness of the metal oxide layer over which each metal foil is in contact with the insulating layer is from 1 to 8 nm.

13. The electromagnetic shielding material according to claim 1, wherein no chromium oxide is formed on the surface of the metal foil.

\* \* \* \* \*